United States Patent [19]

Seki et al.

[11] Patent Number: 5,053,099

[45] Date of Patent: Oct. 1, 1991

[54] FILM BONDING METHOD AND APPARATUS FOR PERFORMING SAME

[75] Inventors: Mitsuhiro Seki, Tokyo; Shigeo Sumi, Saitama; Takashi Goto, Tokyo, all of Japan

[73] Assignee: Somar Corporation, Tokyo, Japan

[21] Appl. No.: 459,500

[22] Filed: Jan. 2, 1990

[30] Foreign Application Priority Data

Nov. 4, 1989 [JP] Japan .................................. 1-287724

[51] Int. Cl.⁵ .............................................. B32B 31/18
[52] U.S. Cl. .................................. 156/250; 156/522; 156/552; 156/555
[58] Field of Search ................ 156/250, 256, 516, 517, 156/519, 521, 522, 552, 555

[56] References Cited

U.S. PATENT DOCUMENTS

| | | | |
|---|---|---|---|
| 4,338,152 | 7/1982 | Del Bianco et al. | 156/552 |
| 4,585,509 | 4/1986 | Obayashi | 156/552 |
| 4,659,419 | 4/1987 | Miyake | 156/522 |
| 4,714,504 | 12/1987 | Cummings et al. | 156/522 |
| 4,717,441 | 1/1988 | Seki et al. | 156/521 |
| 4,743,325 | 5/1988 | Miyake | 156/522 |
| 4,844,772 | 7/1989 | Sumi et al. | 156/552 |

*Primary Examiner*—Caleb Weston

*Attorney, Agent, or Firm*—Sughrue, Mion, Zinn, Macpeak & Seas

[57] ABSTRACT

The apparatus for bonding a film, having a length corresponding to the length of a board, to a film bonding surface of the board by compression bonding rollers which comprises a conveying device for conveying the board, a board clamp and guide device for clamping and guiding said board at a predetermined position, a film feed member for holding the leading end of the film by suction and feeding the leading end of the film to a film bonding position, a film leading end-holding member provided in the vicinity of the film bonding position, and having a holding surface for face-to-face contact with the leading end of the film fed by the film feed member to the film bonding position, the film leading end-holding member having film suction apertures connected to a vacuum system so as to cause the leading end of the film to be held on the holding surface by suction, compression bonding rollers for bonding the film, held at the film bonding position by the film feed member, from its leading toward trailing end to the film bonding surface of the board from the leading end to trailing end of the board, and a cutting device for cutting the continuous film at its trailing side into a length corresponding to the length of the board in the direction of feed thereof.

5 Claims, 6 Drawing Sheets

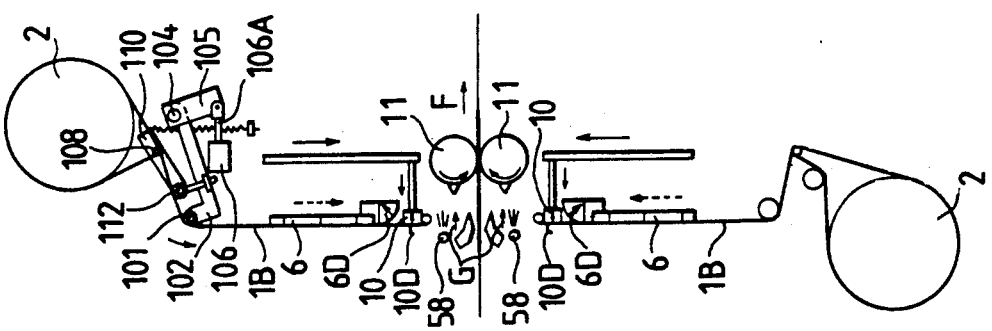
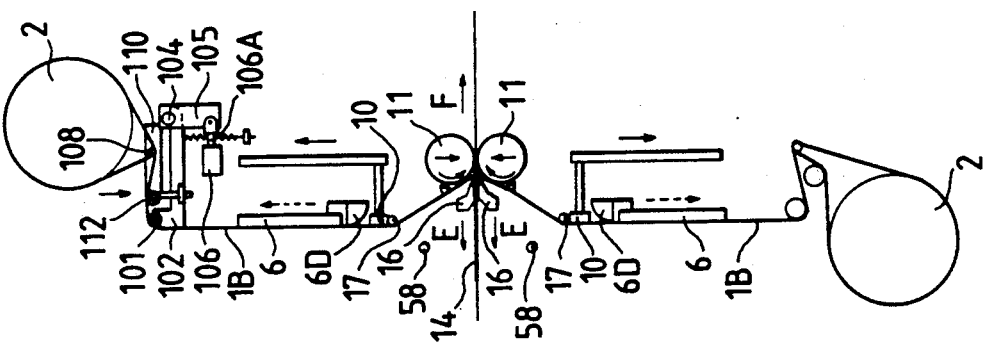
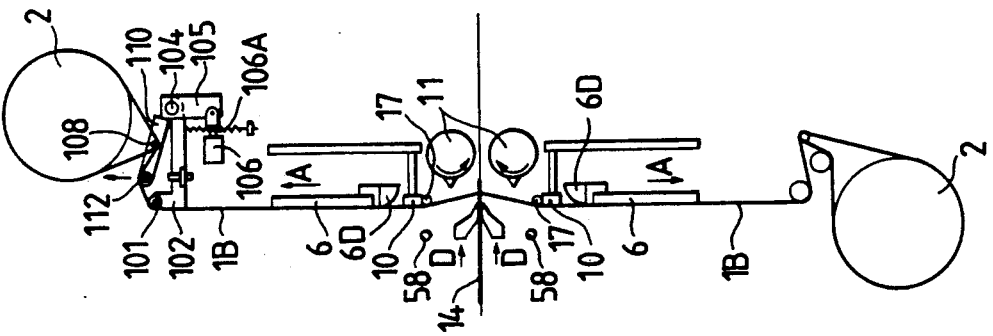
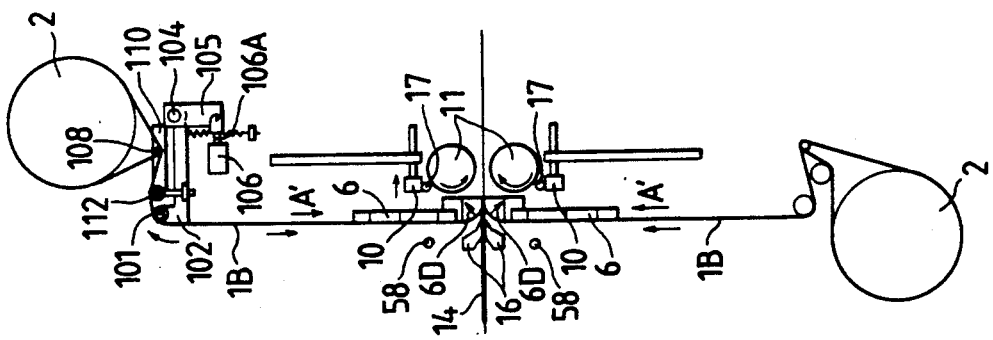
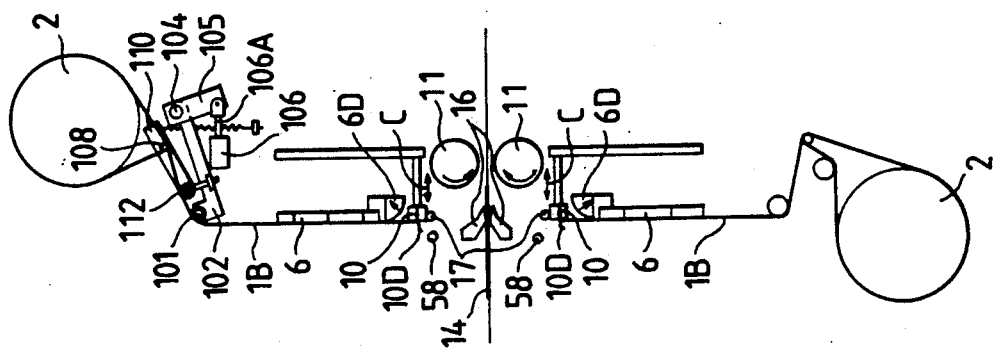

FILM BONDING METHOD AND APPARATUS FOR PERFORMING SAME

BACKGROUND OF THE INVENTION

This invention relates generally to a film bonding method and an apparatus for performing such a method, and more particularly to a method of and apparatus for thermocompression-laminating a laminate film (thin sheet), composed of a photosensitive resin layer and a light-permeable resin film, onto a board for a printed wiring.

There is already known, for example, from Japanese Laid- Open (Kokai) Patent Application No. 85927/85 and West German Patent No. 3334009, a method in which boards for printed wirings are conveyed by a roller conveyor or the like, and a laminate film is continuously cut into a length corresponding to the length of the board and is bonded thereto.

However, in the above conventional film bonding apparatus, a pair of upper and lower compression bonding rollers are fixedly provided at a film bonding position at a path of feed of the board. Therefore, a film feed member is moved near the film bonding surface of the leading end of the board so as to provisionally bond or retain the leading end of the continuous film to the film bonding surface, and then the film feed member is moved away from the film bonding surface of the board. Thereafter, the board with the film provisionally bonded thereto must be moved to the position of the compression bonding rollers. If the board (particularly where the board is thin) is curved during this movement of the board, there has been encountered a problem that the film provisionally bonded to the board is separated from the board.

SUMMARY OF THE INVENTION

In order to overcome this problem, it is an object of this invention to provide a technique for preventing a film, provisionally bonded to a board, from being separated from the board when the board with the film provisionally bonded thereto is moved to compression bonding rollers.

This and other objects and novel features of the present invention will become manifest upon making reference to the detailed description of this specification and the accompanying drawings.

The above object has been achieved by a method of bonding a film, having a length corresponding to the length of a board, to a film bonding surface of said board by compression bonding rollers, comprising the steps of:

conveying said board to a predetermined position;

holding that portion of said board, disposed adjacent to the leading end of said board, by a board clamp and guide device at said predetermined position;

holding the leading end of the continuous film on a film feed member by suction;

moving said film feed member near or against the film bonding surface of the leading end of said board, conveyed to said predetermined position, to retain or provisionally bond the leading end of the continuous film relative thereto;

releasing the suction-holding of the film on said film feed member, and moving said film feed member away from said film bonding surface of said board;

moving said board clamp and guide device, holding said board, so as to move the leading end of the film, retained or provisionally bonded relative to said film bonding surface of the leading end of said board, toward said compression bonding rollers;

moving said compression bonding rollers vertically to press the film against said board;

releasing the holding of said board by said board clamp and guide device, and retracting said board clamp and guide device, and bonding the film to said film bonding surface of said board from its leading end toward its trailing end while the film is automatically fed by the rotation of said compression bonding rollers;

cutting the continuous film at its trailing side into a length corresponding to the length of said board in the direction of feed thereof when said board is moved a predetermined distance in the direction of feed of said board, while the film is bonded to said board; and bonding the trailing end of the thus cut film to the filing bonding surface of the trailing end of said board.

The above method is also characterized in that said step of holding the film on said board clamp and guide device by suction is carried out after carrying out the step of moving said film feed member near or against the film bonding surface of the leading end of said board, conveyed to said predetermined position, to retain or provisionally bond the leading end of the continuous film relative thereto.

Further, the invention provides apparatus for bonding a film, having a length corresponding to the length of a board, to a film bonding surface of said board by compression bonding rollers, comprising:

a conveying device for conveying said board;

a board clamp and guide device for clamping and guiding said board at a predetermined position;

a film feed member for holding the leading end of the film by suction and feeding the leading end of the film to a film bonding position;

a film leading end-holding member provided in the vicinity of said film bonding position, and having a holding surface for fact-to-face contact with the leading end of the film fed by said film feed member to said film bonding position, said film leading end-holding member having film suction apertures connected to a vacuum system so as to cause the leading end of the film to be held on said holding surface by suction;

compression bonding rollers for bonding the film, held at said film bonding position by said film feed member, from its leading toward trailing end to the film bonding surface of said board from the leading end to trailing end of said board; and a cutting device for cutting the continuous film at its trailing side into a length corresponding to the length of said board in the direction of feed thereof.

Further, the above apparatus is characterized in that a reverse surface of a board clamp member of said board clamp and guide device facing away from its board holding surface has a shape to be mated with a forward end portion of said film feed member.

Further, the above apparatus is characterized in that film suctioning holes are formed in a reverse surface of a board clamp member of said board clamp and guide device facing away from its board holding surface.

According to the above means, the board is conveyed to the predetermined position; that portion of the board, disposed adjacent to the leading end of the board is held by the board clamp and guide device, and the board is conveyed by this device; the leading end of the continuous film is held on the film feed member by suction; the film feed member is moved near or against the film bonding surface of the leading end of the board, conveyed to said predetermined position, to retain or provisionally bond the leading end of the continuous film relative thereto; the suction-holding of the film on the film feed member is released, and the film feed member is moved away from the film bonding surface of the board; the board clamp and guide device, holding said board, is moved so as to move the leading end of the film, retained or provisionally bonded relative to the film bonding surface of the leading end of said board, toward the compression bonding rollers; the compression bonding rollers are vertically moved to press the film against the board; the holding of the board by the board clamp and guide device is released, and the board clamp and guide device is retracted, and the film is bonded to the film bonding surface of the board from its leading end toward its trailing end while the film is automatically fed by the rotation of the compression bonding rollers. Therefore, even if the board is thin, the film provisionally bonded at its leading end to the board can be prevented from being separated from the board when the board to which the film is provisionally bonded is moved to the position of the compression bonding rollers.

The film is held on the board clamp and guide device by suction after carrying out the step of moving the film feed member near or against the film bonding surface of the leading end of the board, conveyed to the predetermined position, to retain or provisionally bond the leading end of the continuous film relative thereto. Therefore, the film provisionally bonded to the board can be positively prevented from being separated from the board.

BRIEF DESCRIPTION OF THE DRAWINGS

FIGS. 8 to 12 are views illustrative of the laminating operation of the film bonding apparatus of FIG. 1.

DESCRIPTION OF THE PREFERRED EMBODIMENTS

Figure 1:
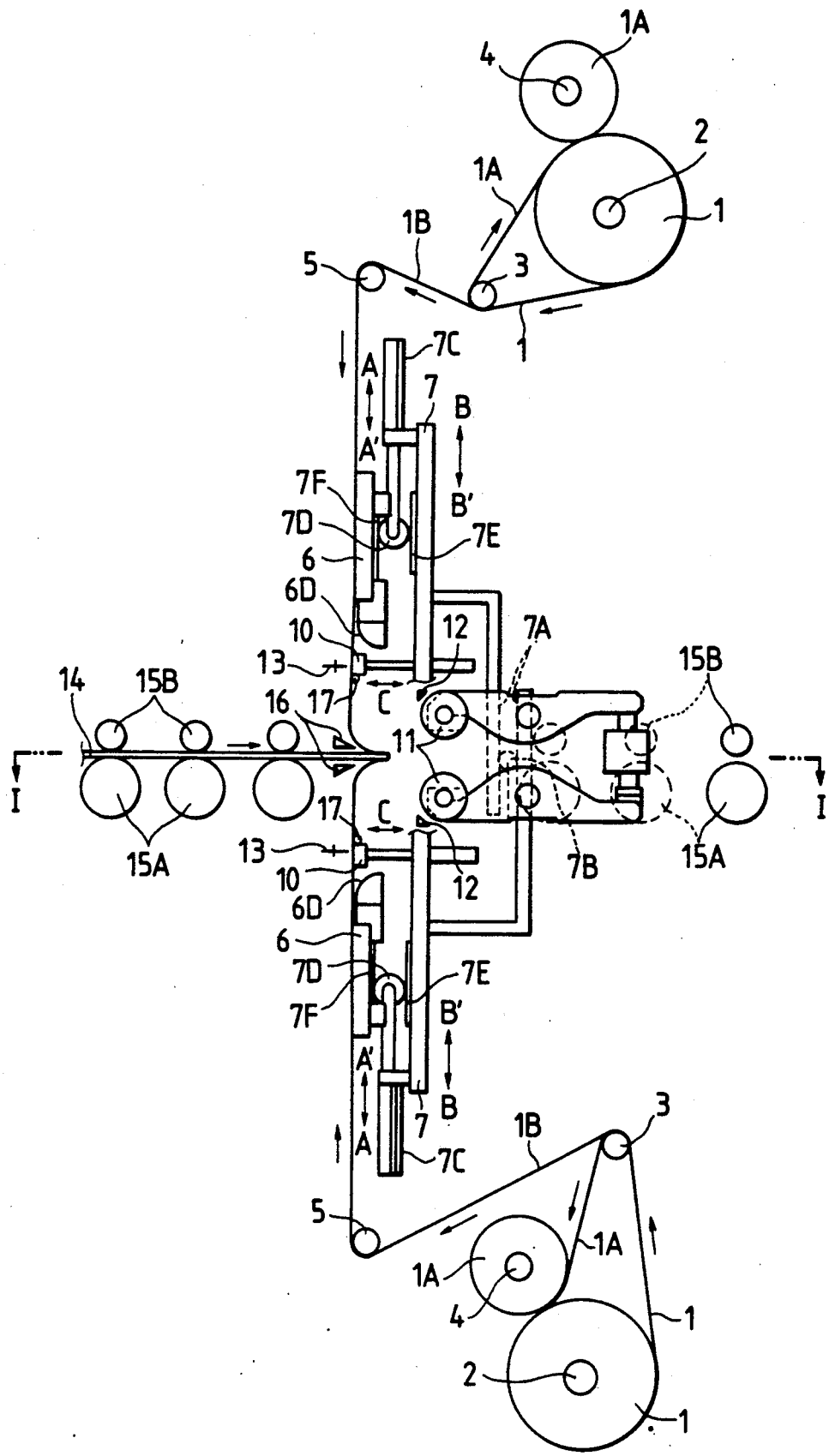
FIG. 1 is a schematic view of the overall construction of a preferred embodiment of a film bonding apparatus of the present invention.

A preferred embodiment of the invention will now be described in detail with reference to the drawings.

In all the figures of the drawings, those parts performing the same functions are denoted by the same reference numerals, respectively, and a repetition of explanation of the similar parts will be omitted.

FIG. 1 schematically shows a basic construction of a film bonding apparatus of the invention for thermocompression-laminating a laminate film, composed of a photosensitive resin layer and a light-permeable resin film, onto each of front and reverse sides of a board for a printed wiring.

As shown in FIG. 1, the film bonding apparatus of this embodiment comprises supply rollers 2 each having the laminate film 1 continuously wound therearound, the laminate film 1 being composed of three layers (i.e., a light-permeable resin film, a photosensitive resin layer and a light-permeable resin film). The laminate film 1 on each supply roller 2 is separated by a film separating roller 3 into the light-permeable resin film 1A (protective film) and a laminate film 1B composed of the other light-permeable resin film and the photosensitive resin layer having one side (bonding surface) exposed.

The light-permeable resin film 1A thus separated is taken up by a tape-up roller 4. The pair of supply rollers 2 as well as the pair of take-up rollers 4 are arranged respectively on the upper and lower sides of a path of travel of boards indicated by I—I and spaced equidistantly therefrom.

The leading end of the separated laminate film 1B in the direction of its feed is fed to a main vacuum plate (film feed member) 6 via a tension roller 5.

The main vacuum plate 6 is movable toward and away from a film bonding position in directions of a double-head arrow A. More specifically, the main vacuum plate 6 is mounted on a pair of support members 7 slidably mounted on guide rails which are mounted on the body of the apparatus (i.e., the frame of the film bonding apparatus). The pair of support members 7 are arranged respectively on the upper and lower sides of the board travel path I—I, and spaced equidistantly therefrom. The upper and lower support plates 7 are movable toward and away from each other in directions of a double-head arrow B by a rack-and-pinion mechanism which comprises racks 7A and a pinion 7B in mesh with the racks 7A. A drive source comprises, for example, an air cylinder. The movement of the main vacuum plates 6 is made in response to the movement of the upper and lower support members 7 toward and away from each other. Each main vacuum plate 6 is moved by a drive source 7C, mounted on the support member 7, and a rack-and-pinion mechanism connected to this drive source. This rack-and-pinion mechanism comprises a pinion 7D connected to a shaft of the drive source 7C, a rack 7E mounted on the support member 7, and a rack 7F mounted on the reverse side of the main vacuum plate 6 which faces away from that side thereof for contact with the laminate film 1B (FIG. 1). Thus, the main vacuum plates 6 can move in the directions of the arrow A independently of each other.

A forward end portion 6D of the main vacuum plate 6 disposed close to the film bonding position has a film suction surface of an arcuate shape, and a plurality of film suction apertures are formed therein. Against the resiliency of the laminate film 1B, the leading end of the laminate film 1B in the direction of feed thereof can be held on the arcuate surface of the forward end portion 6D by suction.

The film suction apertures communicate with a vacuum generating source via a shut-off valve. When this valve is turned to a closed condition, the suction-holding is released. In order to ensure a positive release of this suction-holding, the film suction apertures may be so arranged as to communicate with a compressed air source when the valve is in its closed position.

The leading end of the laminate film 1B held on the forward end portion 6D by suction is fed to a film provisionally-bonding position when the main vacuum plate 6 is moved in the direction of arrow A'.

In the vicinity of the path of feed of the laminate film 1B, a film leading end-holding member 10 is provided between the main vacuum plate 6 and the film provisionally-bonding position. The pair of film leading end-holding members 10 are arranged respectively on the upper and lower sides of the board travel path I—I and spaced equidistantly therefrom.

The film leading end-holding member 10 is designed to hold the cutting portion of the laminate film 1B and also to enable the forward end portion 6D of the main vacuum plate 6 to hold by suction a fresh leading end of the laminate film 1B from which the preceding length of the film has been cut.

More specifically, the film leading end-holding member 10 is movable toward and away from the path of feed of the laminate film 1B as indicated by a double-head arrow C.

The film leading end-holding member 10 is also designed to hold the trailing end of the cut length of the laminate film 1B when the laminate film 1B is cut at its cutting portion. A disc cutter 13 is provided so as to move at a position opposed to the film leading end-holding member 10. A film guide roller 17 is provided at the corner portion of the film leading end-holding member 10 so as to prevent this corner portion from damaging the laminate film 1B.

Each thermocompression bonding roller. 11 is vertically movable toward the leading end of the laminate film 1B provisionally bonded in the film bonding position, and automatically feeds the laminate film 1B by its rotation to bond the laminate film 1B to a film-bonding surface of a board 14 for a printed wiring from its leading end toward its trailing end over a predetermined distance.

Each of vacuum bars 12 serves to hold by suction the trailing end of the laminate film 1B to be laminated under heat and pressure by the thermocompression bonding rollers 11, so as to apply an appropriate tension to the laminate film 1B so that the laminate film 1B will not have wrinkles and the like. The vacuum bar 12 is rotatable along the periphery of thermocompression bonding roller 11 at a region opposite to the direction of feed of the board 14 for the printed wiring. The pair of thermocompression bonding rollers 11 as well as the pair of vacuum bars 12 are arranged respectively on the upper and lower sides of the board travel path I—I and spaced equidistantly therefrom.

The boards 14 for printed wirings are transferred or conveyed along the board travel path I—I by a board conveying mechanism mounted within or on the film bonding apparatus. More specifically, the board conveying mechanism is designed to convey each board 14 to a position near to the film provisionally-bonding position, and in this position, a board clamp and guide device 16 holds that portion of the board 14 disposed slightly rearwardly of the portion thereof to which the laminate film 1B is to be provisionally bonded, and the laminated film 1B is provisionally bonded to the leading end portion of the board 14 for the printed wiring. Then, the board conveying mechanism transfers or moves the board 14, having the laminate film provisionally bonded thereto, to the film bonding position where the laminate film is bonded to the board 14 by the thermocompression bonding rollers 11. In this embodiment, after the laminate film 1B is thermocompression-laminated to the board 14 for the printed wiring, the board is transferred from the film bonding position to the next stage. The board conveying mechanism broadly comprises drive rollers 15A and driven rollers 15B.

Figure 2:
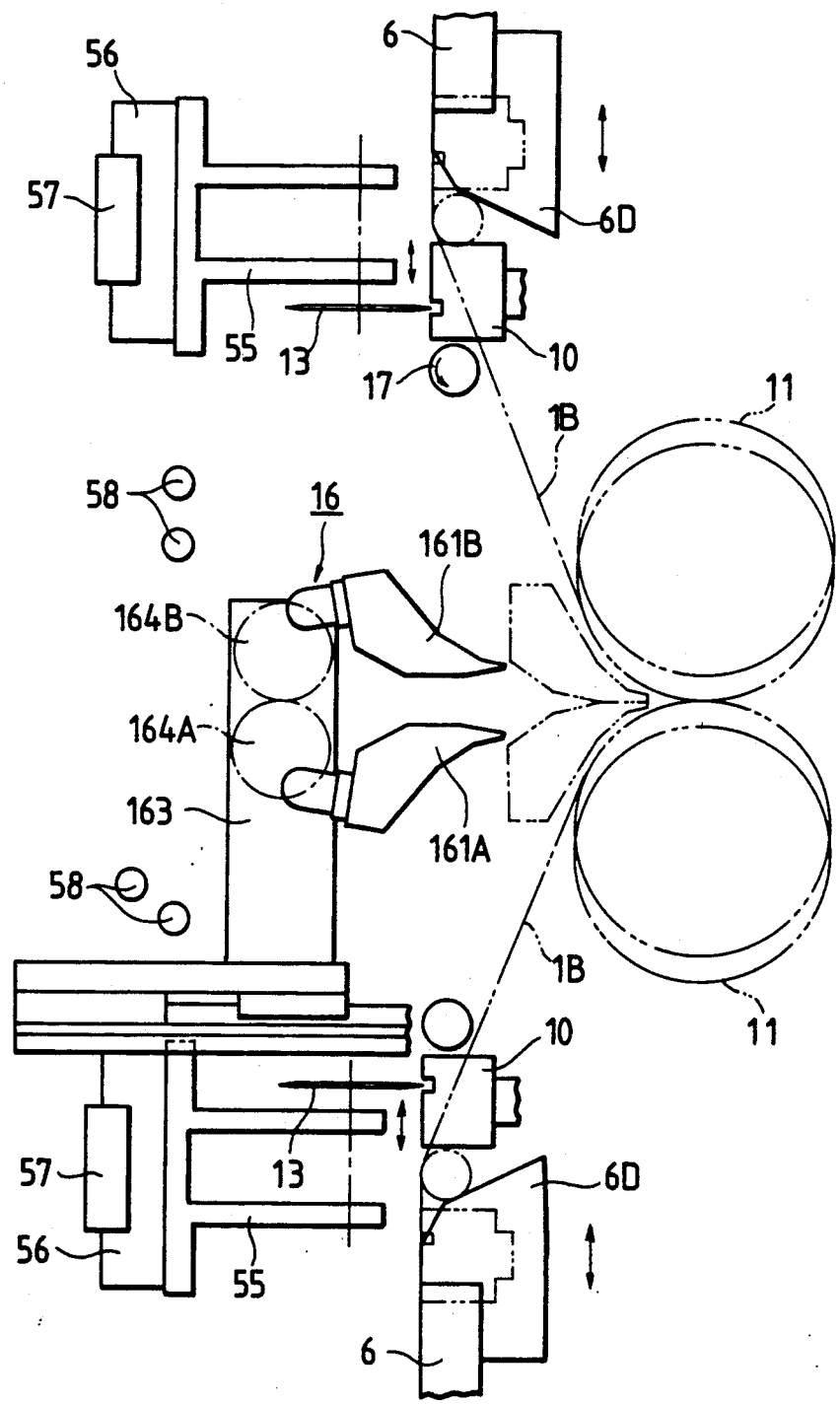
FIGS. 2 to 7 are views illustrative of the construction of a board clamp and guide device shown in FIG. 1.
Figure 3:
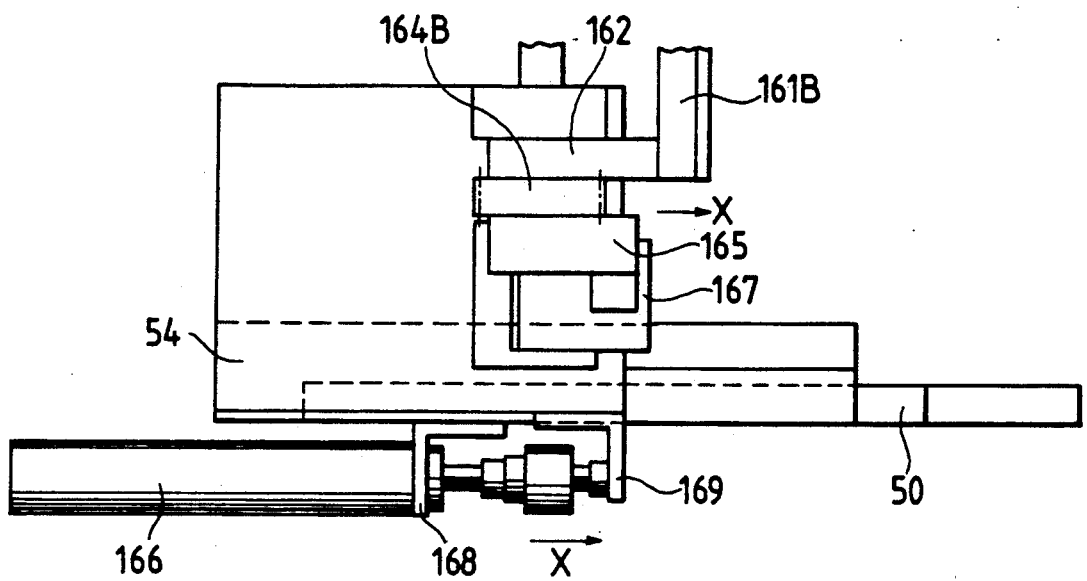
Figure 5:
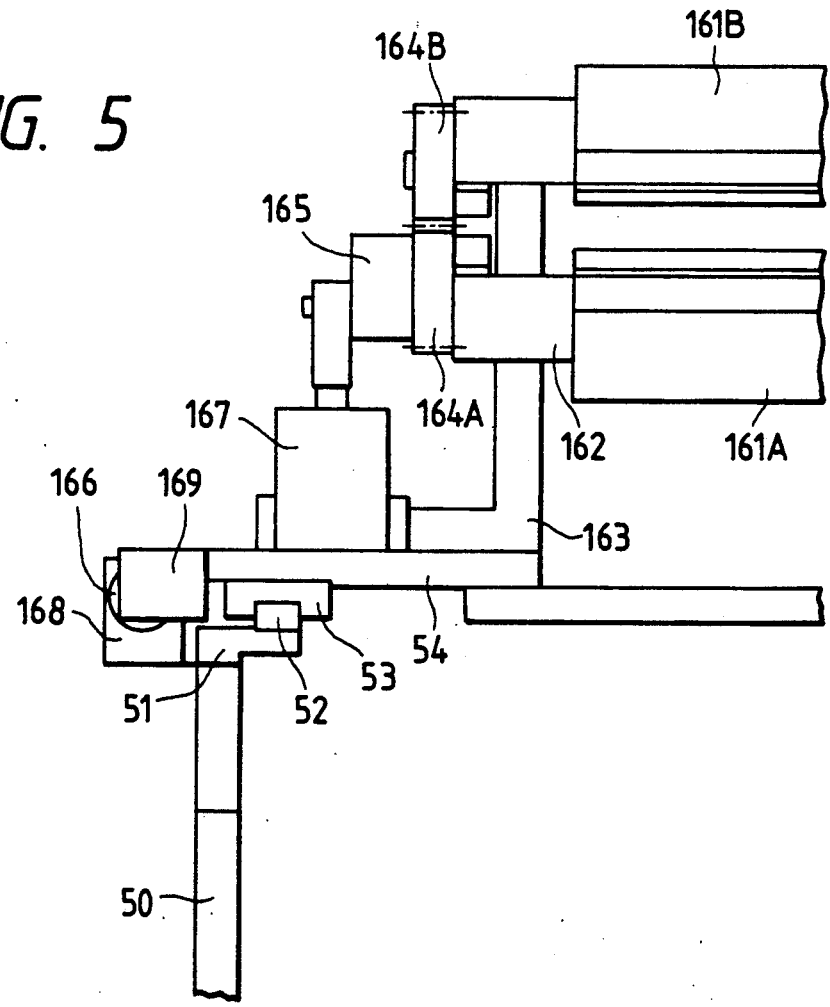
Figure 4:
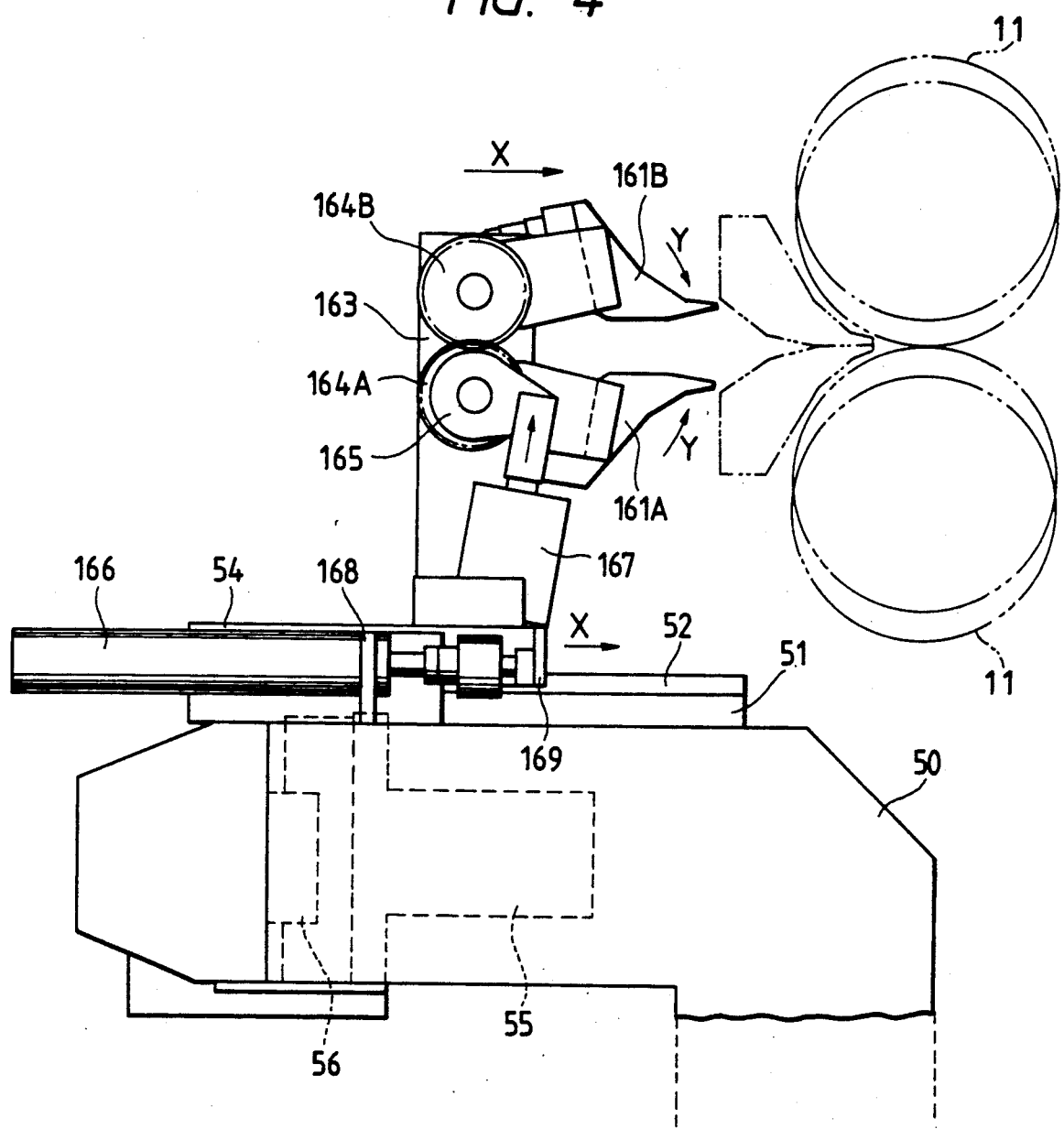
Figure 6:
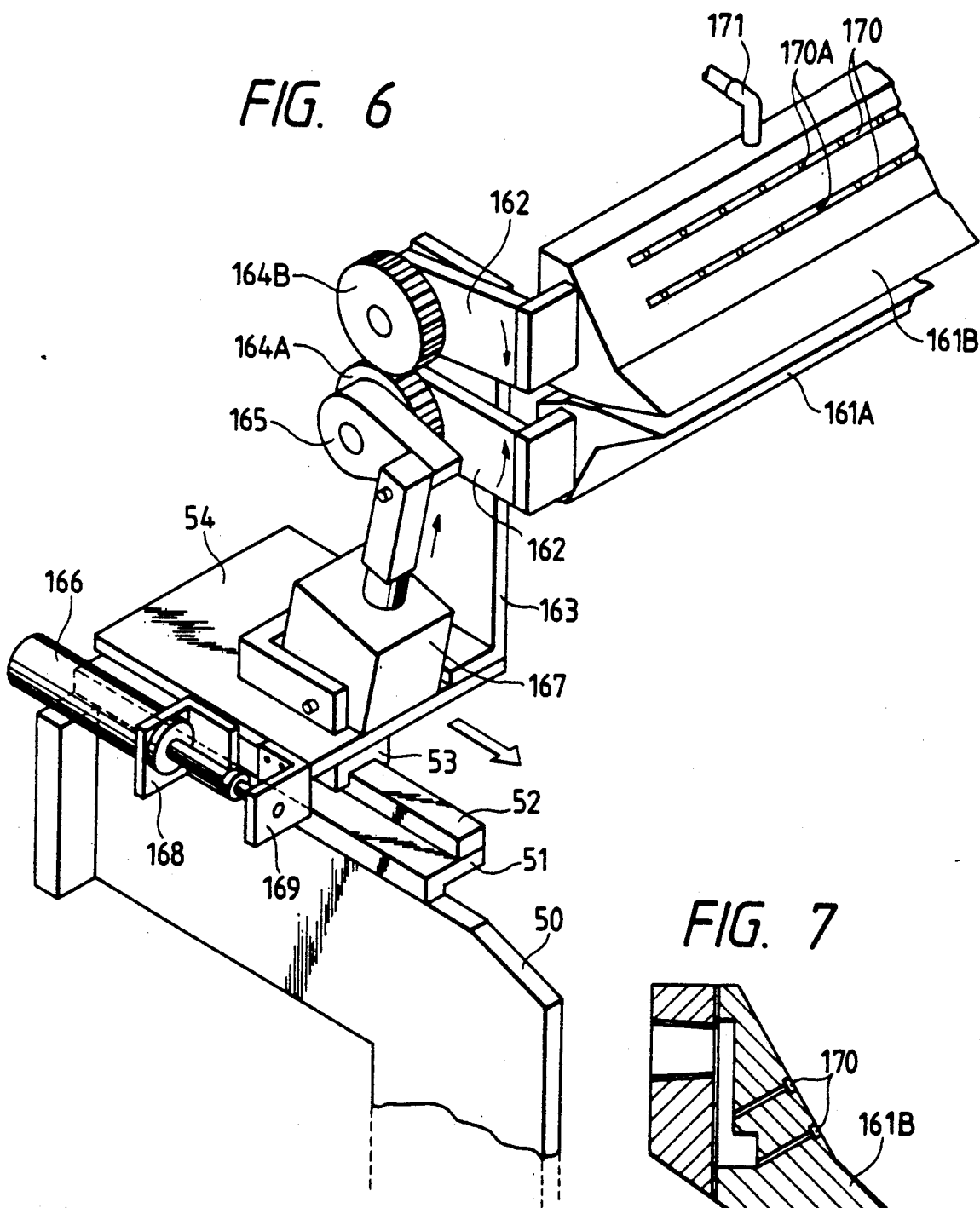

FIG. 2 is a side-elevational view showing general constructions of the thermocompression bonding rollers 11, the disc cutters 13 and the board clamp and guide device 16. FIG. 3 is a front-elevational view of the board clamp and guide device of FIG. 2. FIG. 4 is a side-elevational view as viewed from the left side of FIG. 3. FIG. 5 is a top plan view of the device of FIG. 3. FIG. 6 is a perspective view showing the general construction of the board clamp and guide device 16 of FIG. 2.

Referring to FIGS. 2 to 6, a support base 51 is mounted on an upper end of a mounting frame 50 mounted on the apparatus body. A guide rail 52 is mounted on the upper surface of the support base 51. As best shown in FIG. 6, a guide member 53 is mounted on the guide rail 52 for sliding movement therealong. A movable support base 54 is mounted on the guide member 53 for movement therewith. A movable portion of a first air cylinder 166 is connected to the movable support base 54 through a mounting member 169 so as to slidingly move the guide member 53. The first air cylinder 166 is mounted on the support base 51 through a mounting member 168. A support frame 163 of a board holder 161 as well as a second air cylinder 167 is mounted on the movable support base 54. A crank 165 is pivotally connected at one end to a movable portion of the second air cylinder 167. A first gear 164A is fixedly mounted on a rotatable shaft of the crank 165. A first holder member (lower holder member) 161A of the board holder 161 is mounted on the first gear 164A through a board holder bracket 162. The first gear 164A is in mesh with a second gear 164B, and a second holder member (upper holder member) 161B of the board holder 161 is mounted on the second gear 164B through a board holder bracket 162.

The board holder 161 is moved by the first air cylinder 166 in a direction of arrow X (FIG. 4), and is rotated by the second air cylinder 167 in a direction of arrow Y.

In FIG. 2, reference numeral 55 denotes a cutter unit, reference numeral 56 a guide member for the cutter unit 55, reference numeral 57 a guide rail for the cutter unit 55, and reference numeral 58 an air blow pipe for urging the slackened film in the direction of feed of the board.

Figure 7:
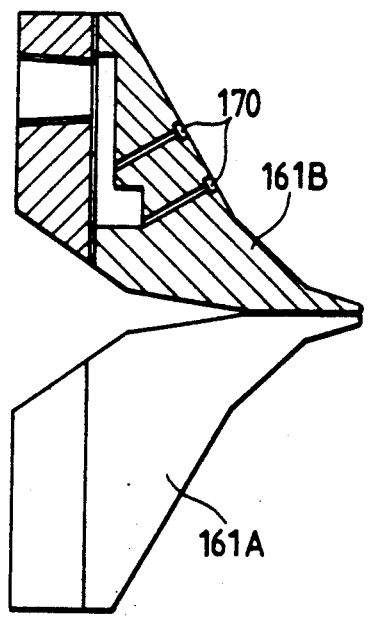

As shown in FIGS. 1, 6 and 7, the outer or reverse surfaces of the board holders 161A and 161B (board clamp members) of the board clamp and guide device 6 facing away from their board holding surfaces are so formed as to mate with the forward end portions 6D of the film feed members 6, respectively. Film suctioning grooves 170 are formed in the outer surface of each board holder (board clamp member) 161A, 161B facing away from its board holding surface, and a plurality of film suctioning holes 170A are formed in the bottom of each film suctioning groove 170 at predetermined positions. Reference numeral 171 denotes a fitting for a suctioning air pipe.

Next, the film bonding method using the film bonding apparatus of this embodiment (that is, the operation of the apparatus) will now be described.

FIGS. 8 to 12 are views illustrative of the film bonding method (that is, the operation of the film bonding apparatus of this embodiment).

In FIGS. 1, 8 and 12, each movable guide roller 101 for supporting and guiding the laminate film 1B is supported at their opposite ends by one end of a movable guide roller support arm 102. The other end of the movable guide roller support arm 102 is fixedly secured to a rotation transmitting bar 104 pivotally connected to a support member (mounting metal member for mounting the support arm to the apparatus body). A crank 105 is connected at one end to the rotation transmitting bar 104, and a movable member 106A of a cylinder 106 (e.g., air cylinder) is pivotally connected to the other end of the crank 105. The cylinder 106 is mounted on the apparatus body through a cylinder bracket.

A tape is wound on the movable guide roller 101, the tape having a suitable frictional resistance so that it can pull the laminate film 1B in the direction of the width thereof in right and left directions by rotation of the movable guide roller 101 to thereby prevent longitudinal wrinkles from developing on the laminate film. This tape also has such a function that the feed rates of the opposite ends of the laminate film 1 can be always kept equal to each other. Namely, since the feed rates of the opposite ends of the laminate film 1 sometimes slightly differ from each other depending on the condition of winding of laminate film on the supply roller 2, the tape compensates for this. Therefore, the tape is wound on the whole or part of the periphery of the movable guide roller 10 depending on requirements.

A separate roller 108 (corresponding to the film separating roller 3) is rotatably mounted at its opposite ends on the above support member through bearings.

The separate roller 108 separates the laminate film 1 into the light-permeable resin film (protective film) 1A and the laminate film 1B composed of the photosensitive resin layer (whose one side is exposed to serve as a bonding surface) and the light-permeable resin layer.

Each end of the separate roller 108 is connected to a swing roller support arm 110 intermediate opposite ends thereof. One end of the swing roller support arm 110 is pulled by a spring in the vicinity of the rotation transmitting bar 104 connected to the movable guide roller support arm 101, so that the swing roller support arm 110 can rotate about the above bearings together with the separate roller 108. Opposite ends of a swing roller 112 are supported respectively by the other ends of the swing roller support arms 110. A swing roller stop member is mounted on that portion of the swing roller support arm 110 disposed adjacent to the swing roller 112.

First, as shown in FIG. 8, the leading end of the laminate film 1B separated by the separate roller 108 is manually put on the film leading end-holding member 10.

Then, the film suction surface 10D of the film leading end-holding member 10 holds the leading end of the laminate film 1B by suction.

Then, the film leading end-holding member 10 is moved by the drive source in the direction of arrow C to move the leading end of the laminate film 1B away from the path of feed of the laminate film 1B, so that the leading end of the laminate film 1B is held on the forward end portion 6D of the main vacuum plate 6 by suction.

Then, the board conveying mechanism causes the leading end of the board 14 (which has been transferred by the drive and driven rollers 15A and 15B (FIG. 1) along the board feed path I—I to stop at the film provisionally-bonding position. This stopping is effected by detecting the leading end of the board 14 for the printed wiring through a sensor and by stopping the drive rollers 15A of the board conveying mechanism in accordance with a detection signal from the sensor. The second air cylinder 167 of the board clamp and guide device 16 is operated so that the board holders 161A and 161B hold the thus stopped board 14 for the printed wiring therebetween.

Then, as shown in FIG. 9, the forward end portion 6D of the main vacuum plate 6 is moved in the direction of arrow A' toward the surface (film bonding surface) of the leading end of the board 14 stopped at the film provisionally-bonding position, thereby feeding the leading end of the laminate film 1B to the film provisionally-bonding position. Then, the forward end portion 6D is brought into engagement with the film bonding surface of the leading end of the board 14 for the printed wiring.

At this time, the movable guide roller support arm 102 is made horizontal by retracting the movable member 106A of the cylinder 106, and the movable guide roller 101 is moved to such a horizontal position that the laminate film 1B is disposed in the plane of the suction surface of the main vacuum plate 6. The swing roller arms 110 are also made horizontal by the movable guide roller 101 and the tension of the laminate film 1B, and the swing roller 112 is moved to substantially the same plane (that is, a horizontal position) as the plane in which the movable guide roller 101 is disposed.

Thus, the movable guide roller 101 is arranged so that at the time of provisionally bonding the laminate film 1B, the laminate film 1B can be always arranged in the plane of the suction surface of the main vacuum plate 6. With this arrangement, since the laminate film 1B which is being fed is subjected to tension only in the vertical direction, the laminate film 1B is prevented from being displaced out of place when provisionally bonding the leading end of the laminate film 1B, and besides longitudinal wrinkles are prevented from developing on the laminate film 1B.

Then, as shown in FIG. 10, the suction-holding of the laminate film 1B by the main vacuum plate 6 and its forward end portion 6D is released, and the main vacuum plate 6 and the forward end portion 6D are moved away from the film provisionally-bonding position in the direction of arrow A.

At this time, even though the movable guide roller support arm 102 is kept horizontally, the swing roller arms 110 are changed from the horizontal position to a slanting position slanting in a left-hand direction because the tension of the laminate film 1B becomes lower, so that the swing roller 112 is moved to a level higher than the movable guide roller 101.

Thus, because of the provision of the swing roller arms 110, the slackening of the laminate film 1B being fed is prevented even when the suction-holding of the laminate film 1B by the main vacuum plate 6 and its forward end portion 6D is released. Therefore, longitudinal wrinkles are prevented from developing on the laminate film 1B when the laminate film 1B is bonded to the board 14.

Next, after the main vacuum plate 6 and its forward end portion 6D are moved away from the film provisionally-bonding position, the board clamp and guide device 16 is moved toward the thermocompression bonding rollers 11 (i.e., toward the film bonding position) in the direction of arrow D in FIG. 10. When the board clamp and guide device 16 comes to the position of the thermocompression bonding rollers 11 (i.e., the film bonding position) as shown in FIG. 11, the thermocompression bonding roller 11 is pressed against the leading end of the laminate film 1B under a suitable force. Then, the board clamp and guide device 16 is retracted in the direction of arrow E, and the board 14 for the printed wiring is conveyed in the direction of arrow F by the rotation of the thermocompression bonding rollers 11, thus starting the thermocompression-laminating.

At this time, as in FIG. 9, because of the tension of the laminate film 1B, the swing roller 112 is moved to a substantially horizontal position disposed in substantially the same plane as the plane in which the movable guide roller 101 is disposed.

Then, as shown in FIG. 12, during the time when the laminate film 1B is automatically fed by the rotation of the thermocompression bonding rollers 11, the laminate film 1B is bonded to the film bonding surface of the board 14 from its leading end toward its trailing end over a predetermined distance.

During the time when the thermocompression bonding rollers 11 bond the laminate film 1B to the board 14 for the printed wiring and convey the board 14 in the direction of feed thereof, each laminate film 1B is supplied from the supply roller 2.

When a sensor provided at the feed path detects the arrival of the trailing end of the laminate film 1B at a predetermined position in the board conveying mechanism, the main vacuum plate 6 and the film leading end-holding member 10 hold the laminate film 1B by suction. In this case, the length of the laminate film 1B extending between the film leading end-holding member 10 and the point of contact between the thermocompression bonding rolls 11 is substantially equal to the length of that portion of the surface of the board 14 to which the laminate film is not yet bonded.

The rotation of the supply roller 2 is stopped by a brake so as to stop the supply of the laminate film 1B from the supply roller 2, and the main vacuum plate 6 holds the laminate film 1B by suction. The driving of the main vacuum plate 6, thus holding the laminate film 1B, to quickly move the main vacuum plate 6 toward the board 14 for the printed wiring is carried out in synchronism with the driving of the cylinder 106 to extend its movable member 106A to slant the movable guide roller support arm 102 in a left-hand direction. At this time, the amount of displacing of the movable guide roller 101 is equal to the amount of slackening of the laminate film 1B (i.e., the distance of movement of the main vacuum plate 6). In order to direct the slackened portion in the direction of feed of the board, air is injected from an air blow pipe 58 in a direction of arrow G (FIG. 12).

In this condition, the laminate film 1B is cut by the disc cutter 13.

As can be appreciated from the foregoing description, in this embodiment, the leading end of the board 14 for the printed wiring is conveyed to the predetermined position; the board clamp and guide device 16 holds that portion of the board, disposed adjacent to the leading end of the board; the leading end of the continuous laminate film 1B is held on the film feed member 6 by suction; the film feed member 6 is abutted against the film bonding surface of the leading end of the board 14, conveyed to the predetermined position, to provisionally bond the leading end of the continuous laminate film 1B thereto; the film feed member 6 is moved away from the film bonding surface of the board 14; the board clamp and guide device 16, holding the board 14, is moved so as to move the leading end of the laminate film 1B, retained on said film bonding surface of the leading end of the board 14, toward the thermocompression bonding rollers 11; the thermocompression bonding rollers 11 are vertically moved to press the laminate film 1B against the board 14; the holding of the board 14 by the board clamp and guide device 16, and the board clamp and guide device 16 is retracted, and the laminate film 1B is bonded to the film bonding surface of the board 14 from its leading end toward its trailing end while the laminate film 1B is automatically fed by the rotation of the thermocompression bonding rollers 11. Therefore, even if the board 14 for the printed wiring is thin, the laminate film 1B provisionally bonded at its leading end to the board 14 can be prevented from being separated from the board 14 when the board 14 to which the laminate film 1B is provisionally bonded is moved to the position of the thermocompression bonding rollers 11.

Further, the laminate film 1B can be held on the board clamp and guide device 16 by suction after carrying out the step of moving the film feed member 6 near the film bonding surface of the leading end of the board 14, conveyed to the predetermined position, to provisionally bond the leading end of the continuous laminate film relative thereto. By doing so, the laminate film 1B provisionally bonded to the board 14 for the printed wiring can be positively prevented from being separated from the board 14.

Further, the laminate film 1B can be held on the board clamp and guide device 16 by suction after carrying out the step of moving the film feed member 6 near the film bonding surface of the leading end of the board 14, conveyed to the predetermined position, so that the film feed member 6 is disposed very close to the leading end of the laminate film 1B, without provisionally bonding the leading end of the laminate film 1B to the board 14. In this case, the suction-holding of the film by the film feed member 6 is released, and the leading end of the laminate film 1B is held by the board clamp and guide device 16 by suction. By doing so, the leading end of the laminate film 1B can be moved to the position of the thermocompression bonding rolls 11 without provisionally bonding the leading end of the laminate film 1B.

While the invention has been specifically described herein by way of the embodiment of the invention, the invention itself is not to be restricted to the above embodiment, and various modifications can be made without departing from the spirits of the invention.

As described above, in the present invention, even if the board is thin, the film provisionally bonded to the board can be prevented from being separated from the board when the board to which the film is provisionally bonded is moved to the position of the compression rollers.

We claim:

1. A method of bonding a film, having a length corresponding to the length of a board, to a film bonding surface of said board by compression bonding rollers, comprising the steps of:

conveying said board in a board feeding direction to a predetermined position;

holding that portion of said board, disposed adjacent to a leading end of said board, by a board clamp and guide device at said predetermined position;

holding a leading end of a continuous film on a film feed member by suction;

moving said film feed member near or against the film bonding surface of the leading end of said board, conveyed to said predetermined position, to retain or provisionally bond the leading end of the continuous film relative thereto;

releasing the suction-holding of the film on said film feed member, and moving said film feed member away from said film bonding surface of said board;

moving said board clamp and guide device, holding said board, so as to move the leading end of the film, retained or provisionally bonded relative to said film bonding surface of the leading end of said board, toward said compression bonding rollers;

moving said compression bonding rollers vertically to press the film against said board;

releasing the holding of said board by said board clamp and guide device, and retracting said board clamp and guide device, and bonding the film to said film bonding surface of said board from its leading end toward its trailing end while the film is automatically fed by the rotation of said compression rollers;

cutting the continuous film along a trailing side into a length corresponding to the length of said board after said board is moved a predetermined distance in said board feeding direction, and while the film is bonded to said board; and bonding the trailing end of thus cut film to the film bonding surface of the trailing end of said board.

2. A film bonding method according to claim 1, in which said step of holding the film on said board clamp and guide device by suction is carried out after carrying out the step of moving said film feed member near or against the film bonding surface of the leading end of said board, conveyed to said predetermined position, to retain or provisionally bond the leading end of the continuous film relative thereto.

3. Apparatus for bonding a film, having a length corresponding to the length of a board, to a film bonding surface of said board by compression bonding rollers, comprising:

a conveying device for conveying said board in a board feeding direction;

a board clamp and guide device for clamping and guiding said board at a predetermined position;

a film feed member for holding a leading end of the film by suction and feeding the leading end of the film to a film bonding position;

a film leading end-holding member provided in the vicinity of said film bonding position, and having a holding surface for face-to-face contact with the leading end of the film fed by said film feed member to said film bonding position, said film leading end-holding member having film suction apertures connected to a vacuum system so as to cause the leading end of the film to be held on said holding surface by suction;

compression bonding rollers for bonding the film, held at said film bonding position by said film feed member, to the board by bonding from leading ends of the film and board toward trailing ends of the film and board; and a cutting device for cutting the continuous film along said trailing end into a length corresponding to a length of said board aligned in said board feeding direction.

4. A film bonding apparatus according to claim 3, in which a reverse surface of a board clamp member of said board clamp and guide device facing away from its board holding surface has a shape to be mated with a forward end portion of said film feed member.

5. A film bonding apparatus according to claim 3 or claim 4, in which film suction holes are formed in a reverse surface of a board clamp member of said board clamp and guide device facing away from its board holding surface.

* * * * *